(12) United States Patent
Lee et al.

(10) Patent No.: US 8,304,174 B2
(45) Date of Patent: Nov. 6, 2012

(54) METHOD FOR FABRICATING SEMICONDUCTOR DEVICE

(75) Inventors: Ki Lyoung Lee, Hwaseong-si (KR); Cheol Kyu Bok, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 810 days.

(21) Appl. No.: 12/164,071

(22) Filed: Jun. 29, 2008

(65) Prior Publication Data

US 2009/0170035 A1 Jul. 2, 2009

(30) Foreign Application Priority Data

Dec. 28, 2007 (KR) .................. 10-2007-0140859
May 28, 2008 (KR) .................. 10-2008-0049895

(51) Int. Cl.
*G03F 7/20* (2006.01)
(52) U.S. Cl. ...................................................... 430/314
(58) Field of Classification Search .................. 430/311, 430/314, 316, 319
See application file for complete search history.

(56) References Cited

U.S. PATENT DOCUMENTS

| 6,955,961 | B1 | 10/2005 | Chung | |
|---|---|---|---|---|
| 2005/0136675 | A1* | 6/2005 | Sandhu et al. | 438/700 |
| 2006/0046484 | A1 | 3/2006 | Abatchev et al. | |
| 2007/0212892 | A1* | 9/2007 | Caspary et al. | 438/736 |
| 2007/0238308 | A1 | 10/2007 | Niroomand et al. | |
| 2009/0035584 | A1* | 2/2009 | Tran et al. | 428/446 |

FOREIGN PATENT DOCUMENTS

| JP | 2007350970 A | 11/2007 |
|---|---|---|
| JP | 2008027978 A | 2/2008 |
| KR | 1020060010921 A | 2/2006 |
| KR | 1020060020227 A | 3/2006 |
| WO | 2008108921 A | 9/2008 |

* cited by examiner

*Primary Examiner* — Brittany Raymond
(74) *Attorney, Agent, or Firm* — Kilpatrick Townsend & Stockton LLP

(57) ABSTRACT

A method for fabricating a semiconductor device includes forming a first mask pattern over an etch target layer, forming a second mask pattern over the etch target layer, forming spacers at sidewalls of the first mask pattern and the second mask pattern, and etching the etch target layer with an etching mask where the second mask pattern is removed. The method improves a profile of a pad pattern and critical dimension uniformity.

18 Claims, 7 Drawing Sheets

METHOD FOR FABRICATING SEMICONDUCTOR DEVICE

CROSS-REFERENCES TO RELATED APPLICATIONS

Priority to Korean patent applications numbers 10-2007-0140859 and 10-2008-49895, filed on Dec. 28, 2007 and May 28, 2008 respectively, which are incorporated by reference in its entirety, is claimed.

BACKGROUND OF THE INVENTION

The present invention relates to a method for fabricating a semiconductor device using a spacer patterning technology (SPT).

As the degree of integration of semiconductor devices has increased, the size and pitch of patterns that form circuits have been reduced. For forming a fine pattern in the semiconductor device, various manufacturing equipments and process methods have been suggested.

Photo lithography process (also called optical lithography) is a process used in micro fabrication to selectively remove parts of a thin film (or the bulk of a substrate). It uses light to transfer a geometric pattern from a photo mask to a light-sensitive chemical (photo-resist, or simply "resist") on the substrate. According to Rayleigh's equation, the size of a fine pattern in a semiconductor device is in proportion to the wavelength of light used in the photo lithography process and is in inverse proportion to the size of the lens used in such a process. As a result, the wavelength of the lights used in the exposure process has been reduced or the size of lens has been increased in order to obtain a fine pattern. However, these methods require development of new manufacturing equipment and cause difficulty in management of the equipment; and, thus, manufacturing cost is increased.

For overcoming above described problem, there have been suggested other methods for forming a fine pattern of high integration by using conventional equipment, not new manufacturing equipment. One is a double patterning technology that performs an exposure process for patterning a photo-resist film with different masks twice to print a circuit pattern, and the other is a Spacer Patterning Technology (SPT) using a spacer as an etching mask for obtaining a fine pattern. Hereinafter, the SPT is described in detail.

FIGS. 1a to 1e are cross-sectional diagrams illustrating a SPT of a conventional semiconductor device, specifically, a method for forming a control gate of a flash memory device. Generally, the flash memory device includes a cell string connected to a plurality of (16 or 32) control gates and a switching transistor for connecting a Source Selection Line (SSL) and a Drain Selection Line (DSL) positioned at both ends of the cell string.

Referring to FIG. 1a, an etch target layer 110 is formed over a semiconductor substrate 100, and a sacrificial film 120 is formed over the etch target layer 110. The etch target layer 110 has a deposition structure including a polysilicon 110a and a nitride film 110b. The sacrificial film 120a includes a Tetra Ethyl Ortho Silicate (TEOS) oxide film. The deposition thickness of the sacrificial film 120a determines a height of a spacer used in the SPT.

A hard mask layer 160, a Bottom Anti-Reflection Coating (BARC) film 170 and a first photo-resist film are formed over the sacrificial film 120a. However, when an exposure process is performed, it is difficult to form a first fine photo-resist pattern defined in a mask by a difference in refractive indexes between a photo-resist film and the hard mask formed in the bottom of the photo-resist film. As a result, the BARC film 170 is used to prevent the photo-resist film 180 from being damaged by a light reflected due to a difference in refractive indexes between the photo-resist film and the hard mask.

Generally, an Anti-Reflection film has been used in a semiconductor lithography process as a thin light-absorbing photo-resist material layer used to form a fine circuit stably. In the Anti-Reflection film, a contact interface and a light characteristic are required to be well-fitting with a photo-resist material having high resolution used in a conventional process. The Anti-Reflection film regulates a substrate reflection index in a corresponding wavelength range to obtain a photo-resist pattern having no standing wave or no notching. Also, the Anti-Reflection film improves critical dimension (CD) uniformity and adhesiveness of the photo-resist pattern with the substrate. As a result, the Anti-Reflection film plays an important role in a DUV process. The Anti-Reflection film includes a top Anti-Reflection coating (TARC) film formed on the photo-resist film and a BARC film formed in the bottom of the photo-resist film. The BARC film has been widely used to obtain a fine circuit pattern.

Referring to FIG. 1a, the BARC film 170 and the hard mask layer 160 are etched with the first photo-resist pattern 180 as a mask. The sacrificial film 120a is etched with the patterned hard mask layer 160 to form a sacrificial pattern 120. After the sacrificial pattern 120 is formed, the first photo-resist pattern 180, the Anti-Reflection film 170 and the hard mask layer 160 are removed.

Referring to FIG. 1b, a spacer material layer is formed over the resulting structure including the sacrificial pattern 120. An etch-back process is performed to form a spacer 130 at sidewalls of the sacrificial pattern 120. The spacer 130 includes a polysilicon, and defines the control gate.

Referring to FIG. 1c, a wet etching process is performed to remove the sacrificial pattern 120 so that only the spacer 130 remains.

Referring to FIG. 1d, a second photo-resist pattern 140 for defining a gate of a switching transistor is formed in a peripheral region not in the middle region having a plurality of control gates formed in the semiconductor substrate 100.

The switching transistor connected to the SSL and DSL in the peripheral region is generally disposed at both ends of the cell string. In the exposure process, the switching transistor may have a defective focus rather than that of the control gates formed in the middle region. As defocus of the peripheral region becomes worse, a manufacturing margin of depth of focus (DOF) is insufficient. Also, the switching transistor for connecting the selecting lines SSL and DSL is related to turning-on of a channel so as to require accurate control on CD of positions and sizes of patterns. Furthermore, the sizes (widths) of the switching transistor and the selecting lines are larger than those of the control gates included in the cell string, so that it is difficult to form a fine pattern using the spacer 130. As a result, an additional second photo-resist pattern 140 is required in the peripheral region.

Referring to FIG. 1e, the etch target layer 110 is etched with the spacer 130 and the second photo-resist pattern 140 as a mask to form etch target patterns 155a and 155b that define a plurality of control gates and a gate of the switching transistor disposed at both ends of the cell string.

A third photo-resist pattern (not shown) is formed to expose the outer edge of the semiconductor substrate where the etch target patterns 155a and 155b are formed. The third photo-resist pattern (not shown) is a cutting mask for separating a spacer portion of a line end region generated in deposition of the spacer material layer. A part of the etch target patterns 155a and 155b disposed at the line end is removed with the third photo-resist pattern (not shown) as a mask to separate each line, and the third photo-resist pattern (not shown) is removed.

In the SPT, when the photo-resist pattern 140 having a pad type that defines a gate of the switching transistor is formed, a BARC film is formed before the photo-resist pattern 140 is formed, thereby preventing the photo-resist pattern 140 from being damaged. However, the BARC film cannot be formed due to the previously formed spacer 130. As shown in FIG. 1d, when the BARC film cannot be formed while the spacer 130 is formed, the photo-resist pattern 140 may have a defective profile and other defects.

Although the Anti-Reflection film may be deposited to have a given thickness in the peripheral region having no spacer 130 when the Anti-Reflection film is deposited while the spacer 130 is formed, the Anti-Reflection film is not formed in a fine region between the spacers 130 but deposited to have a high thickness. In this case, the Anti-Reflection film is deposited to improve profile and CD uniformity characteristics of the photo-resist pattern 140. However, when the etch target layer 110 is etched after the photo-resist pattern 140 having a pad type is formed, the method is required to include removing the Anti-Reflection film with the photo-resist pattern 140 as a mask. Also, the thickness of the photo-resist pattern 140 is required to increase, so that it is impossible to secure a process margin.

When the Anti-Reflection film is removed with an etching gas including $CF_4$ as a base, the spacer 130 is attacked to decrease its height. As a result, an etching selectivity is insufficient in etching the etch target layer 110.

As mentioned above, in the conventional method for fabricating a semiconductor device, it is difficult to apply an Anti-Reflection film in formation of the photo-resist pattern 140 having a pad type, which results in notching due to reflection of lights, in defects of the photo-resist pattern formed in the peripheral region, in scum in a narrow region between patterns and in pattern lifting due to degradation of adhesiveness with the substrate.

BRIEF SUMMARY OF THE INVENTION

Various embodiments of the present invention are directed at providing a method for fabricating a semiconductor device that comprises forming a pattern for pad by applying an Anti-Reflection film before forming an etch target pattern by a cell mask process to improve profile and CD uniformity of the pattern for pad and to prevent scum of photo-resist patterns and pattern lifting, thereby improving characteristic of the device.

According to an embodiment of the present invention, a method for fabricating a semiconductor device includes forming a first mask pattern over an etch target layer, forming a second mask pattern over the etch target layer, forming spacers at sidewalls of the first mask pattern and the second mask pattern, and etching the etch target layer with an etching mask where the second mask pattern is removed. Herein, a material and a size of the second mask pattern are different from those of the first mask pattern.

Preferably, the first mask pattern and the spacer formed at the sidewall of the first mask pattern are used as the etching mask for forming a gate pattern of a switching transistor that connects a source selecting line and a drain selecting line to both ends of a cell string. Also, the spacer formed at the sidewall of the second mask pattern is used as the etching mask for forming a plurality of control gate patterns in the cell string.

According to an embodiment of the present invention, a method for fabricating a semiconductor device includes sequentially forming a coarse mask pattern for forming a gate pattern of a switching transistor and a fine mask patterns for forming a control gate pattern in a cell string, and forming spacers at sidewalls of the coarse mask pattern and the fine mask pattern to perform a STI process.

According to an embodiment of the present invention, a method for fabricating a semiconductor device includes forming an etch target layer over a semiconductor substrate, forming a pad pattern on the etch target layer disposed at the edge of the semiconductor substrate, forming a planarized sacrificial film over the resulting structure including the pad pattern, etching the sacrificial film to form a sacrificial pattern without etching the pad pattern, forming spacers at the sacrificial pattern and the pad pattern, removing the sacrificial pattern to remain the spacers, and etching the etch target layer with the spacers and the pad pattern having the spacers as a mask.

DESCRIPTION OF EMBODIMENTS

FIGS. 2a to 2g are cross-sectional diagrams illustrating a method for fabricating a semiconductor device according to an embodiment of the present invention. In the embodiment, the semiconductor device comprises a cell string connected to a plurality of control gates and a switching transistor for connecting a source selection line (SSL) and a drain selection line (DSL) at both ends of the cell string.

Figure 1A:
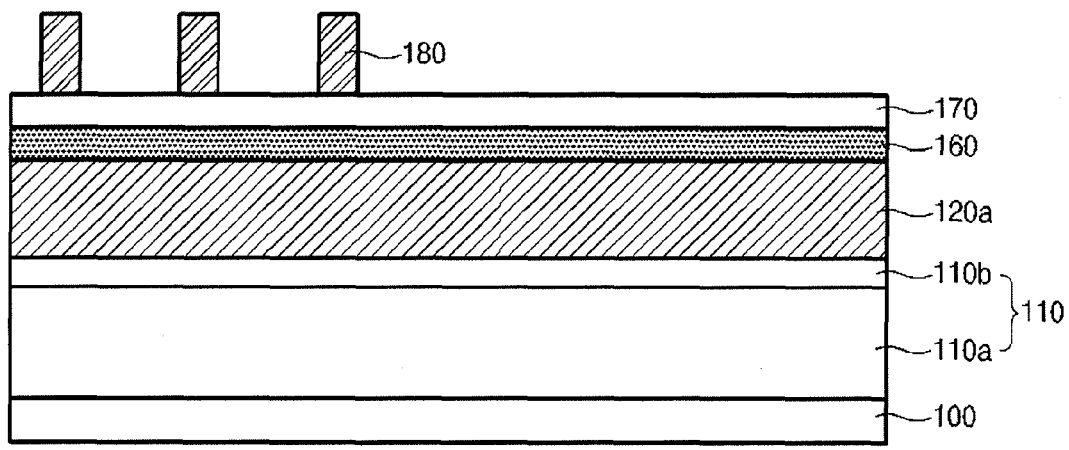
FIGS. 1a to 1e are cross-sectional diagrams illustrating a conventional method for fabricating a semiconductor device.
Figure 1B:
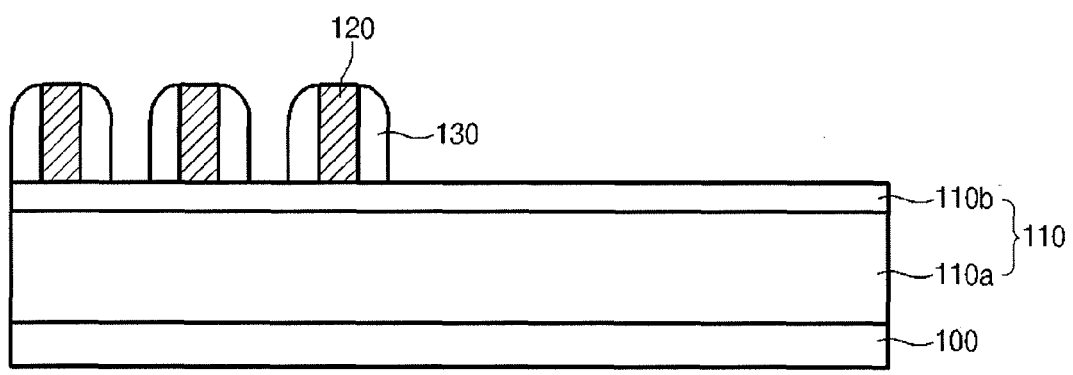
Figure 1C:
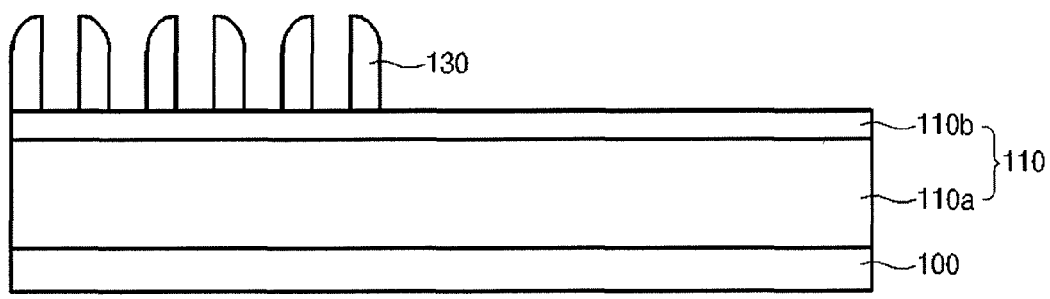
Figure 1D:
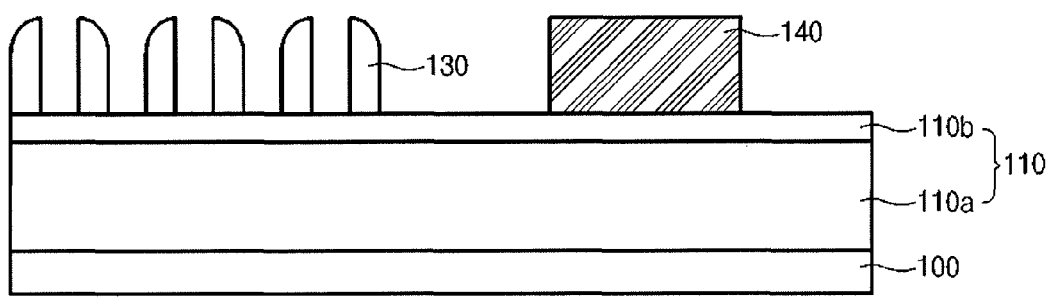
Figure 1E:
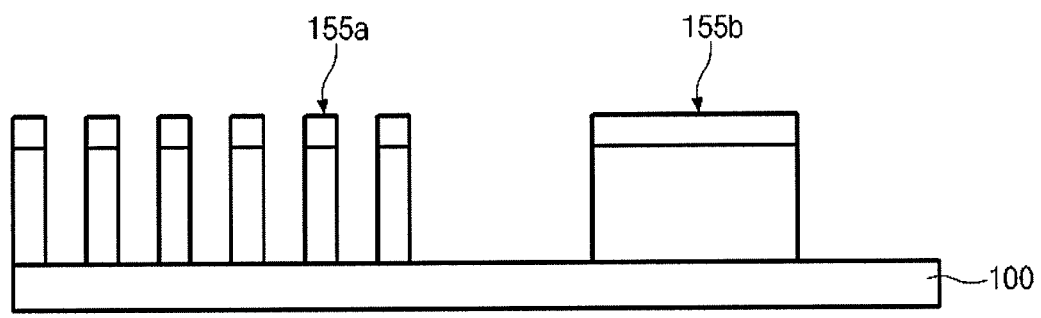
Figure 2A:
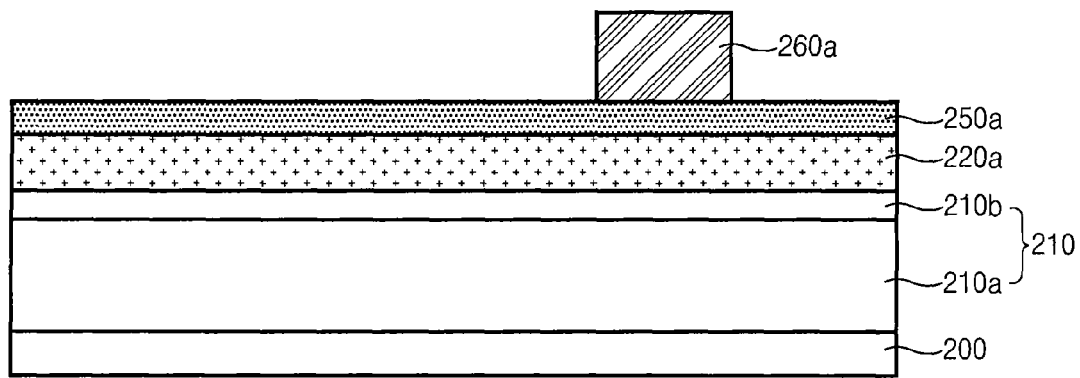
FIGS. 2a to 2g are cross-sectional diagrams illustrating a method for fabricating a semiconductor device according to an embodiment of the present invention.

Referring to FIG. 2a, an etch target layer 210 is formed over a semiconductor substrate 200. A polysilicon layer 220a and a first BARC film 250a are formed over the etch target layer 210. A first photo-resist pattern 260a that defines a pattern for pad is formed over the first BARC film 250a. The etch target layer 210 has a deposition structure including a polysilicon 210a and a nitride film 210b.

Figure 2B:
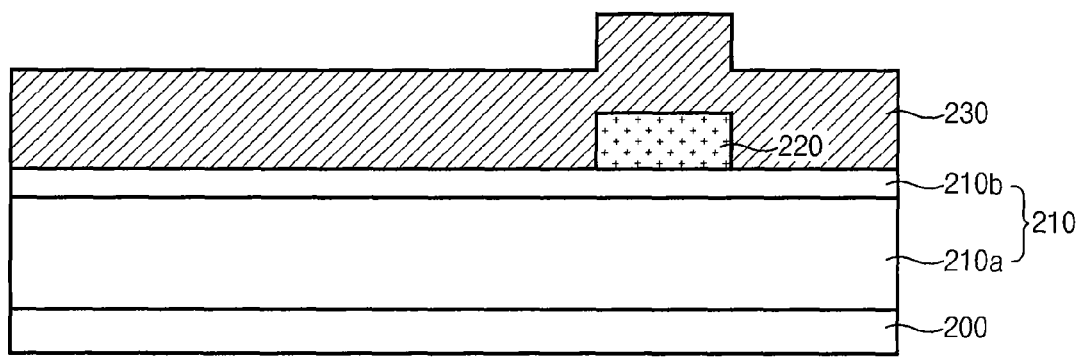

Referring to FIG. 2b, the polysilicon layer 220a is etched with the first photo-resist pattern 260a as a mask to form a pattern 220 for pad that defines a gate of the switching transistor for connecting the SSL or DSL. Through a subsequent spacer forming process, a spacer is formed at sidewalls of the pattern 220. As a result, the pattern 220 is formed to be smaller (by the thickness of the spacer) than the gate of the switching transistor.

After the first BARC film 250a is formed, an exposure process is performed to prevent defects or notching of the first photo-resist pattern 260a. That is, after a BARC film is formed over an etch target layer, a photo-resist pattern is formed to reduce reflectivity of the etch target layer, thereby preventing defects of the pattern for pad and scum and lifting of the photo-resist pattern.

Figure 2C:
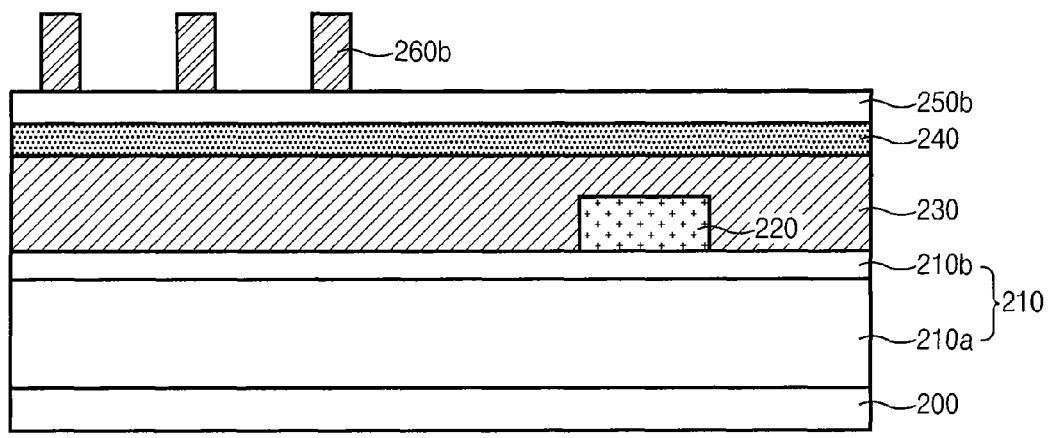

Referring to FIG. 2c, a chemical mechanical polishing (CMP) process is performed to planarize a sacrificial film 230 formed over the pattern 220 and the etch target layer 210.

The sacrificial film 230 includes a TEOS film. Also, the sacrificial film 230 is formed to have over a given height because the sacrificial film 230 determines the height of the spacer in a SPT process. When the sacrificial film 230 is formed to have a low height, it is difficult to form the spacer having a desired height and thickness through subsequent processes. For example, a spacer formed at a side surface of a mask pattern can be deposited at a thickness of about 30 nm once. However, when the mask pattern is not higher than 30 nm, the spacer is formed to have a thinner thickness.

When the sacrificial film 230 is deposited to have a given thickness, a step difference is generated by the pattern 220. The step difference may cause defocus in a subsequent process to degrade a plurality of fine control gate patterns in a cell string. As a result, the CMP process is performed to remove the step difference.

A hard mask 240 and a second Anti-Reflection film 250b are formed over the planarized sacrificial film 230. The hard mask 240 includes a polysilicon because it has an insufficient etching selectivity to etch the sacrificial film 230 positioned in the bottom with the photo-resist pattern.

A second photo-resist pattern 260b that defines a word line is formed over the second Anti-Reflection film 250b.

The second photo-resist pattern 260b is formed to have a line/space type. The ratio of line:space is 1:3.

Figure 2D:
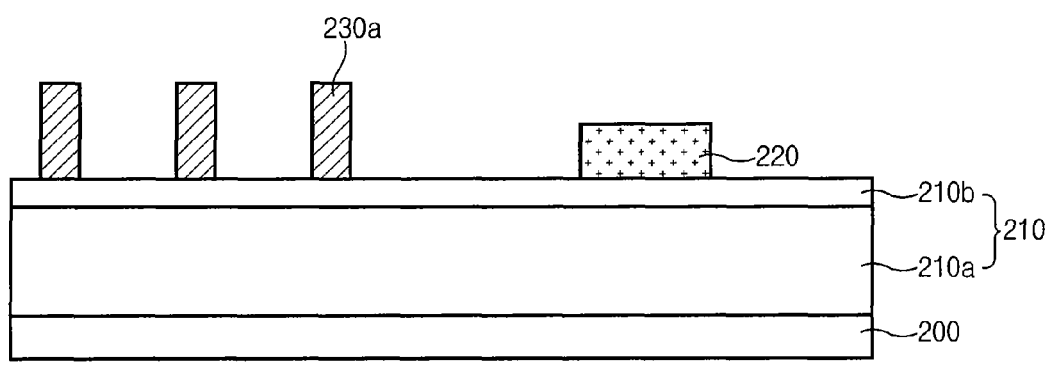

Referring to FIG. 2d, the second Anti-Reflection film 250b and the hard mask 240 are etched with the second photo-resist pattern 260b as a mask.

The bottom sacrificial film 230 is etched with the second photo-resist pattern 260b, the second Anti-Reflection film 250b and the hard mask 240 as a mask.

The pattern 220 is not etched but remains because the sacrificial film 230 has an etching selectivity difference from the TEOS film and the pattern 220 which is a polysilicon.

As shown in FIGS. 2c and 2d, the second Anti-Reflection film 250b prevents defective patterns that may be generated by a refractive index difference of the hard mask 240 when the second photo-resist pattern 260b is formed by the exposure process.

The second photo-resist pattern 260, the second Anti-Reflection film 250 and the hard mask 240 are removed.

Figure 2E:
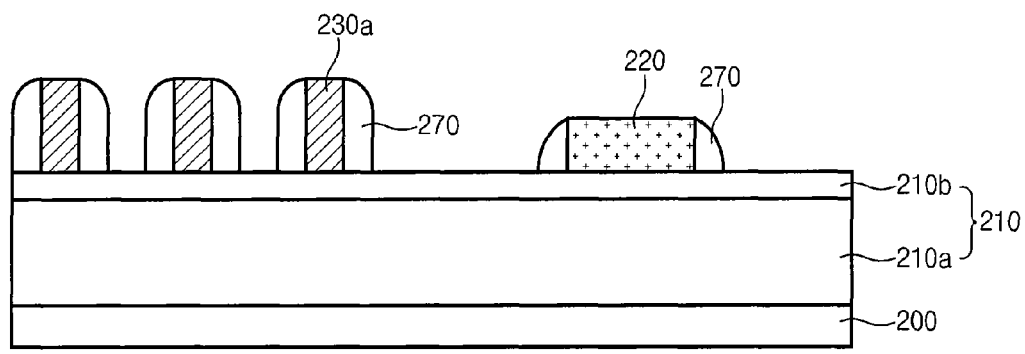

Referring to FIG. 2e, a polysilicon layer that is a spacer forming material is deposited over the resulting structure including a sacrificial pattern 230a and the pattern 220.

Until the sacrificial pattern 230a is exposed, an etch-back process is performed to form a spacer 270 at sidewalls of the sacrificial pattern 230a and the pattern 220.

The spacer 270 is formed at the sidewall of the pattern 220 to increase CD of the pattern 220, so that a gate pattern larger than the pattern 220 may be formed.

Figure 2F:
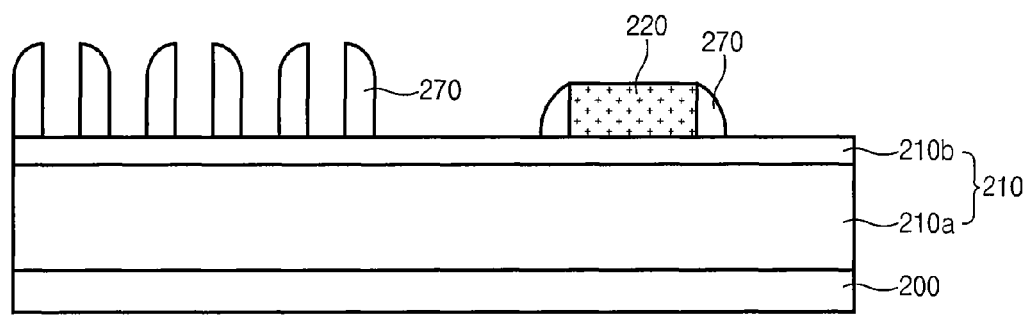

Referring to FIG. 2f, the sacrificial pattern 230a is removed so that the spacer 270 for forming a plurality of control gate patterns in the cell string may remain.

The sacrificial pattern 230a is removed by a wet etching method using HF. The nitride film 210b that is a lower material is not removed due to resistance in the HF solution. The pattern 220 having the same etching selectivity as that of the spacer 270 is not removed either.

Figure 2G:

Referring to FIG. 2g, the etch target layer 210 is etched with the spacer 270 and the pattern 220 where the spacer 270 is formed at sidewalls as a mask. The nitride film 210b and the polysilicon 210a are sequentially etched.

The pattern 220 used as a mask includes a polysilicon, which improves etching uniformity in comparison with other materials used as a mask because the pattern 220 etches the same lower material.

The spacer 270 and the pattern 220 are removed to form etch target patterns 215a and 215b that define a plurality of control gate patterns and a gate of the switching transistor for connecting the SSL or DSL.

A third photo-resist pattern (not shown) is formed which exposes the outer edge of the semiconductor substrate 200 having the etch target patterns 215a and 215b. The third photo-resist pattern (not shown) is a cutting mask for separating a spacer portion disposed at a line end region generated in deposition of the spacer material layer.

A part of the etch target pattern 215 disposed at the line end is removed with the third photo-resist pattern (not shown) as a mask to separate each line, and the third photo-resist pattern (not shown) is removed.

In comparison with the conventional method, a polysilicon film that is an etching mask for forming a coarse gate pattern is first formed and a spacer for forming a fine gate pattern is formed in the embodiment of the present invention while a spacer that is an etching mask for forming a fine gate pattern is first formed and a photo-resist pattern for forming a coarse gate pattern is formed. By a double exposure process, gate patterns each having a different size may be formed in a semiconductor device, thereby decreasing complexity of the process. Furthermore, each exposure process is performed after a BARC film is formed, thereby increasing accuracy in formation of photo-resist patterns each having a different size.

As described above, in a method for fabricating a semiconductor device according to an embodiment of the present invention, an Anti-Reflection film is applied to form a pattern for pad before an etch target pattern is formed by a cell mask process, thereby improving profile and CD uniformity of the pattern for pad and preventing scum of photo-resist patterns and pattern lifting to improve characteristic of the device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:
   forming a first mask pattern on an etch target layer;
   forming a TEOS film over the etch target layer and the first mask pattern;
   forming a hard mask over the TEOS film, the hard mask including a polysilicon;
   forming a second Anti-Reflection film over the hard mask;
   patterning a second photo-resist film formed on the second Anti-Reflection film;
   etching the second Anti-Reflection film, the hard mask, and the TEOS film by using the patterned second photo-resist film as a mask, the etched TEOS film forming a second mask pattern;
   forming a first spacer at a sidewall of the first mask pattern and a second spacer at a sidewall of the second mask pattern;
   removing the second mask pattern; and
   etching the etch target layer by using the first mask pattern, the first spacer, and the second spacer as an etching mask.

2. The method according to claim 1, wherein the first mask pattern and the first spacer formed at the sidewall of the first mask pattern are used as the etching mask for forming a gate pattern of a switching transistor.

3. The method according to claim 2, wherein the second spacer formed at the sidewall of the second mask pattern is used as an etching mask for forming a control gate pattern in a cell string connected to the switching transistor.

4. The method according to claim 1, wherein the first mask pattern includes a polysilicon film, and the second mask pattern includes a TEOS film.

5. The method according to claim 1, wherein the first spacer and the second spacer include a polysilicon film.

6. The method according to claim 1, wherein the act of forming a first mask pattern includes:
   forming a polysilicon layer over the etch target layer;
   forming a first Anti-Reflection film over the polysilicon layer;
   patterning a first photo-resist film formed on the first Anti-Reflection film; and
   etching the first Anti-Reflection film and the polysilicon layer by using the patterned first photo-resist film as a mask.

7. A method for fabricating a semiconductor device, the method comprising:
   forming a coarse mask pattern for forming a gate pattern of a switching transistor;
   forming a sacrificial film over the course mask pattern;
   forming a hard mask over the sacrificial film, the hard mask including a polysilicon;
   forming a second Anti-Reflection film over the hard mask;
   patterning a second photo-resist film formed on the second Anti-Reflection film;
   etching the second Anti-Reflection film, the hard mask, and the sacrificial film by using the patterned second photo-resist film as a mask, the etched sacrificial film forming a fine mask pattern for forming a control gate pattern in a cell string connected to the switching transistor; and
   forming spacers at sidewalls of the coarse mask pattern and the fine mask pattern to perform a spacer patterning technology (SPT) process.

8. The method according to claim 7, wherein the act of forming a coarse mask pattern includes:
   forming a polysilicon layer over an etch target layer;
   forming a first Anti-Reflection film over the polysilicon layer; and
   patterning the polysilicon layer with a coarse photo-resist pattern formed on the first Anti-Reflection film.

9. The method according to claim 7, wherein the coarse mask pattern has the same etching selectivity as that of the spacers, and the fine mask pattern has a different etching selectivity as that of the spacers.

10. The method according to claim 7, wherein the act of performing an SPT process includes:
   forming spacers at sidewalls of the coarse mask pattern and the fine mask pattern;
   removing the fine mask pattern; and
   etching an etch target layer with the spacers and the coarse mask pattern.

11. A method for fabricating a semiconductor device, the method comprising:
   forming an etch target layer over a semiconductor substrate;
   forming a pad pattern on the etch target layer disposed at the edge of the semiconductor substrate;
   forming a planarized sacrificial film over the resulting structure including the pad pattern;
   forming a hard mask over the planarized sacrificial film, the hard mask including a polysilicon;
   forming a second Anti-Reflection film over the hard mask;
   patterning a second photo-resist film formed on the second Anti-Reflection film;
   etching the second Anti-Reflection film, the hard mask, and the sacrificial film without patterning the pad pattern by using the patterned second photo-resist film as a mask, the etched sacrificial film forming a sacrificial pattern;
   forming a first spacer at a sidewall of the sacrificial pattern and a second spacer at a sidewall of the pad pattern;
   removing the sacrificial pattern to remain the first spacer and the second spacer; and
   etching the etch target layer by using the first spacer, the second spacer, and the pad pattern as a mask.

12. The method according to claim 11, wherein the etch target layer has a deposition structure including a polysilicon layer and a nitride film.

13. The method according to claim 12, wherein the sacrificial pattern is etched by a wet etching process using a HF solution.

14. The method according to claim 12, wherein the sacrificial pattern is formed to have a line/space type, and the ratio of line:space is 1:3.

15. The method according to claim 11, wherein the pad pattern defines at least one of a gate for a source selection line (SSL) or a gate for a drain selection line (DSL).

16. The method according to claim 11, wherein a first Anti-Reflection film is included when a first photo-resist pattern for forming the pad pattern is formed.

17. The method according to claim 11, wherein a critical dimension (CD) of the pad pattern is formed to be smaller than that of a target pattern formed by using the pad pattern as part of an etch mask.

18. The method according to claim 11, wherein the sacrificial film includes a TEOS film.

\* \* \* \* \*